(12) United States Patent
Oya et al.

(10) Patent No.: US 8,164,109 B2
(45) Date of Patent: Apr. 24, 2012

(54) NITRIDE SEMICONDUCTOR ELEMENT AND METHOD FOR PRODUCING THE SAME

(75) Inventors: Mitsuaki Oya, Aichi (JP); Toshiya Yokogawa, Nara (JP); Atsushi Yamada, Osaka (JP); Akihiro Isozaki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/167,664

(22) Filed: Jun. 23, 2011

(65) Prior Publication Data

US 2011/0248307 A1    Oct. 13, 2011

Related U.S. Application Data

(63) Continuation of application No. 12/993,305, filed as application No. PCT/JP2010/001879 on Mar. 16, 2010.

(30) Foreign Application Priority Data

Apr. 2, 2009 (JP) .................................. 2009-090064

(51) Int. Cl.
    *H01L 33/00*      (2010.01)
(52) U.S. Cl. .................................. 257/98; 257/E33.063
(58) Field of Classification Search .................... 257/98, 257/99
See application file for complete search history.

(56) References Cited

U.S. PATENT DOCUMENTS

| 5,708,301 | A | 1/1998 | Iyechika et al. |
| 6,303,405 | B1 | 10/2001 | Yoshida et al. |
| 2003/0209714 | A1* | 11/2003 | Taskar et al. ..................... 257/79 |
| 2005/0087758 | A1 | 4/2005 | Kwak et al. |
| 2006/0071226 | A1 | 4/2006 | Kojima et al. |
| 2007/0114555 | A1 | 5/2007 | Takemoto et al. |
| 2009/0057696 | A1* | 3/2009 | Kuo et al. ........................ 257/96 |
| 2009/0184329 | A1 | 7/2009 | Miki et al. |
| 2010/0096615 | A1 | 4/2010 | Okamoto et al. |
| 2010/0258826 | A1 | 10/2010 | Takeuchi |

FOREIGN PATENT DOCUMENTS

| JP | 07-288321 | 10/1995 |
| JP | 10-233531 | 9/1998 |

(Continued)

OTHER PUBLICATIONS

Notice of Reasons for Rejection issued on Aug. 16, 2010 for Japanese Patent Application No. 2010-524272 which is a Japanese national phase application of PCT/JP2010/001879.

Noriaki Mochida et al., "Crystal Orientation Dependence of Contact Resistance of GaN in p-side Contact Layer", Dai 44 Kai Extended Abstracts, Japan Society of Applied Physics and Related Societies, Mar. 28, 1997, No. 1, 28p-D-13, p. 184.

(Continued)

*Primary Examiner* — Matthew Landau
*Assistant Examiner* — Sonya McCall Shepard
(74) *Attorney, Agent, or Firm* — Renner, Otto, Boisselle & Sklar, LLP

(57) ABSTRACT

A nitride-based semiconductor light-emitting device 100 includes: a GaN substrate 10 with an m-plane surface 12; a semiconductor multilayer structure 20 provided on the m-plane surface 12 of the GaN substrate 10; and an electrode 30 provided on the semiconductor multilayer structure 20. The electrode 30 includes a Zn layer 32 and a metal layer 34 provided on the Zn layer 32. The Zn layer 32 is in contact with a surface of a p-type semiconductor region of the semiconductor multilayer structure 20.

21 Claims, 5 Drawing Sheets

FOREIGN PATENT DOCUMENTS

| | | |
|---|---|---|
| JP | 11-016852 | 1/1999 |
| JP | 2000-101139 A | 4/2000 |
| JP | 2001-308462 | 11/2001 |
| JP | 2003-332697 | 11/2003 |
| JP | 2006-100529 | 4/2006 |
| JP | 2007-200932 A | 8/2007 |
| JP | 2008-091354 A | 4/2008 |
| JP | 2008-109066 | 5/2008 |
| JP | 2009-065196 A | 3/2009 |
| JP | 2009-146980 A | 7/2009 |
| JP | 2010-062460 A | 3/2010 |

OTHER PUBLICATIONS

Handbook of Nitride Semiconductors and Devices (2008).

International Search Report for corresponding International Application No. PCT/JP2010/001879 mailed May 11, 2010.

International Search Report for related International Application No. PCT/JP2011/001516 mailed Apr. 12, 2011.

Form PCT/ISA/237 for related International Application No. PCT/JP2011/001516 dated Apr. 12, 2011 and Partial English Translation.

* cited by examiner (a)

(b)

(c)

(a)

(b)

(c)

NITRIDE SEMICONDUCTOR ELEMENT AND METHOD FOR PRODUCING THE SAME

TECHNICAL FIELD

The present invention relates to a nitride-based semiconductor device and a method for fabricating such a device. More particularly, the present invention relates to a GaN-based semiconductor light-emitting device such as a light-emitting diode or a laser diode that operates at wavelengths over the ultraviolet range and the entire visible radiation range, which covers blue, green, orange and white parts of the spectrum. Such a light-emitting device is expected to be applied to various fields of technologies including display, illumination and optical information processing in the near future. The present invention also relates to a method of making an electrode for use in such a nitride-based semiconductor device.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors" and which are represented by the formula $Al_xGa_yIn_zN$ (where $0 \leq x, y, z \leq 1$ and $x+y+z=1$)) have been researched and developed particularly extensively. As a result, blue light-emitting diodes (LEDs), green LEDs, and semiconductor laser diodes made of GaN-based semiconductors have already been used in actual products.

A GaN-based semiconductor has a wurtzite crystal structure. FIG. 1 schematically illustrates a unit cell of GaN. In an $Al_xGa_yIn_zN$ (where $0 \leq x, y, z \leq 1$ and $x+y+z=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane".

In fabricating a semiconductor device using GaN-based semiconductors, a c-plane substrate, i.e., a substrate of which the principal surface is a (0001) plane, is used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer. Consequently, the internal quantum yield decreases due to the quantum confinement Stark effect of carriers, thus increasing the threshold current in a semiconductor laser diode and increasing the power dissipation and decreasing the luminous efficacy in an LED. Meanwhile, as the density of injected carriers increases, the piezoelectric field is screened, thus varying the emission wavelength, too.

Thus, to overcome these problems, it has been proposed that a substrate of which the principal surface is a non-polar plane such as a (10–10) plane that is perpendicular to the [10–10] direction and that is called an "m-plane" (m-plane GaN-based substrate) be used. As used herein, "–" attached on the left-hand side of a Miller-Bravais index in the parentheses means a "bar" (a negative direction index). As shown in FIG. 2, the m-plane is parallel to the c-axis (i.e., the primitive vector c) and intersects with the c-plane at right angles. On the m-plane, Ga atoms and nitrogen atoms are on the same atomic-plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above. The "m-plane" is a generic term that collectively refers to a family of planes including (10–10), (–1010), (1–100), (–1100), (01–10) and (0–110) planes.

Also, as used herein, the "X-plane growth" means epitaxial growth that is produced perpendicularly to the X plane (where X=c or m) of a hexagonal wurtzite structure. As for the X-plane growth, the X plane will be sometimes referred to herein as a "growing plane". A layer of semiconductor crystals that have been formed as a result of the X-plane growth will be sometimes referred to herein as an "X-plane semiconductor layer".

CITATION LIST

Patent Literature
    Patent Document 1: Japanese Laid-Open Patent Publication No. 2001-308462
    Patent Document 2: Japanese Laid-Open Patent Publication No. 2003-332697

SUMMARY OF INVENTION

Technical Problem

As described above, a GaN-based semiconductor device that has been grown on an m-plane substrate would achieve far more beneficial effects than what has been grown on a c-plane substrate but still has the following drawback. Specifically, a GaN-based semiconductor device that has been grown on an m-plane substrate has higher contact resistance than what has been grown on a c-plane substrate, which constitutes a serious technical obstacle to using such a GaN-based semiconductor device that has been grown on an m-plane substrate.

Under the circumstances such as these, the present inventors wholeheartedly carried out extensive research to overcome such a problem with the prior art that a GaN-based semiconductor device, grown on an m-plane as a non-polar plane, would have high contact resistance. As a result, we found an effective means for reducing the contact resistance.

It is therefore an object of the present invention to provide a structure and manufacturing process that will be able to reduce the contact resistance of a GaN-based semiconductor device that has been fabricated by producing a crystal growth on an m-plane substrate.

Solution to Problem

The first nitride-based semiconductor device of the present invention includes: a nitride-based semiconductor multilayer structure including a p-type semiconductor region, a surface of the p-type semiconductor region being an m-plane; and an electrode that is formed on the surface of the p-type semiconductor region, wherein the p-type semiconductor region is made of an $Al_xIn_yGa_zN$ semiconductor (where $x+y+z=1$, $x \geqq 0$, $y \geqq 0$, and $z \geqq 0$), and the electrode includes a Zn layer which is in contact with the surface of the p-type semiconductor region.

In one embodiment, the electrode includes the Zn layer and a metal layer formed on the Zn layer, and the metal layer is made of at least one type of metal selected from the group consisting of Pt, Mo, and Pd.

In one embodiment, the semiconductor multilayer structure includes an active layer which includes an $Al_a In_b Ga_c N$ layer (where $a+b+c=1$, $a \geqq 0$, $b \geqq 0$ and $c \geqq 0$), the active layer being configured to emit light.

In one embodiment, the p-type semiconductor region is a p-type contact layer.

In one embodiment, a thickness of the Zn layer is equal to or smaller than a thickness of the Pt layer.

In one embodiment, the nitride-based semiconductor device further includes a semiconductor substrate that supports the semiconductor multilayer structure.

In one embodiment, the Zn layer is at least partially made of an alloy.

A light source of the present invention includes: a nitride-based semiconductor light-emitting device; and a wavelength converter including a phosphor that converts a wavelength of light emitted from the nitride-based semiconductor light-emitting device, wherein the nitride-based semiconductor light-emitting device includes a nitride-based semiconductor multilayer structure including a p-type semiconductor region, a surface of the p-type semiconductor region being an m-plane, and an electrode that is formed on the surface of the p-type semiconductor region, the p-type semiconductor region is made of an $Al_x In_y Ga_z N$ semiconductor (where $x+y+z=1$, $x \geqq 0$, $y \geqq 0$, and $z \geqq 0$), and the electrode includes a Zn layer which is in contact with the surface of the p-type semiconductor region.

In one embodiment, the Zn layer is at least partially made of an alloy.

A nitride-based semiconductor device fabrication method of the present invention includes the steps of: (a) providing a substrate; (b) forming on the substrate a nitride-based semiconductor multilayer structure including a p-type semiconductor region, a surface of the p-type semiconductor region being an m-plane; and (c) forming an electrode on the surface of the p-type semiconductor region of the semiconductor multilayer structure, wherein step (c) includes forming a Zn layer on the surface of the p-type semiconductor region.

In one embodiment, step (c) includes, after the formation of the Zn layer, forming a metal layer which is made of at least one type of metal selected from the group consisting of Pt, Mo, and Pd.

In one embodiment, step (c) further includes performing a heat treatment on the Zn layer.

In one embodiment, the heat treatment is performed at a temperature of 400° C. to 650° C.

In one embodiment, the heat treatment is performed at a temperature of 450° C. to 600° C.

In one embodiment, the method further includes removing the substrate after step (b).

In one embodiment, the Zn layer is at least partially alloyed.

The second nitride-based semiconductor device of the present invention includes: a nitride-based semiconductor multilayer structure including a p-type semiconductor region, a surface of the p-type semiconductor region being an m-plane; and an electrode that is formed on the surface of the p-type semiconductor region, wherein the p-type semiconductor region is made of an $Al_x In_y Ga_z N$ semiconductor (where $x+y+z=1$, $x \geqq 0$, $y \geqq 0$, and $z \geqq 0$), and the electrode includes a Zn island formed on the surface of the p-type semiconductor region.

In one embodiment, the electrode includes a metal layer formed on the Zn island, and the metal layer is made of at least one type of metal selected from the group consisting of Pt, Mo, and Pd.

The third nitride-based semiconductor device of the present invention includes: a nitride-based semiconductor multilayer structure including a p-type semiconductor region, a surface of the p-type semiconductor region being an m-plane; and an electrode that is formed on the surface of the p-type semiconductor region, wherein the p-type semiconductor region is made of an $Al_x In_y Ga_z N$ semiconductor (where $x+y+z=1$, $x \geqq 0$, $y \geqq 0$, and $z \geqq 0$), the electrode includes a Zn layer which is in contact with the surface of the p-type semiconductor region, and the Zn layer is made of Zn and at least one type of metal selected from the group consisting of Pt, Mo, and Pd.

The fourth nitride-based semiconductor device of the present invention includes: a nitride-based semiconductor multilayer structure including a p-type semiconductor region, a surface of the p-type semiconductor region being an m-plane; and an electrode that is arranged on the p-type semiconductor region, wherein the p-type semiconductor region is made of an $Al_x In_y Ga_z N$ semiconductor (where $x+y+z=1$, $x \geqq 0$, $y \geqq 0$, and $z \geqq 0$), the electrode is made only of an alloy layer which is in contact with the surface of the p-type semiconductor region, and the alloy layer is made of Zn and at least one type of metal selected from the group consisting of Pt, Mo, and Pd.

In one embodiment, the alloy layer is formed by forming a Zn layer so as to be in contact with the surface of the p-type semiconductor region and a metal layer on the Zn layer, and thereafter performing a heat treatment.

Advantageous Effects of Invention

In a nitride-based semiconductor device according to the present invention, an electrode provided on a surface (m-plane) of a p-type impurity region in a semiconductor multilayer structure includes a Zn layer, and the Zn layer is in contact with the surface (m-plane) of the p-type impurity region, so that the contact resistance can be reduced.

DESCRIPTION OF EMBODIMENTS

Figure 1:
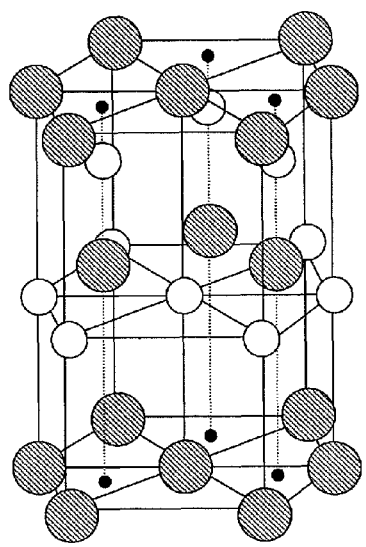
FIG. 1 is a perspective view schematically illustrating a unit cell of GaN.
Figure 1:
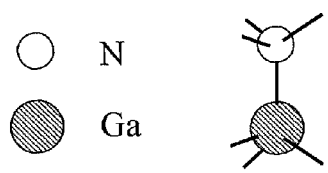
Figure 2:
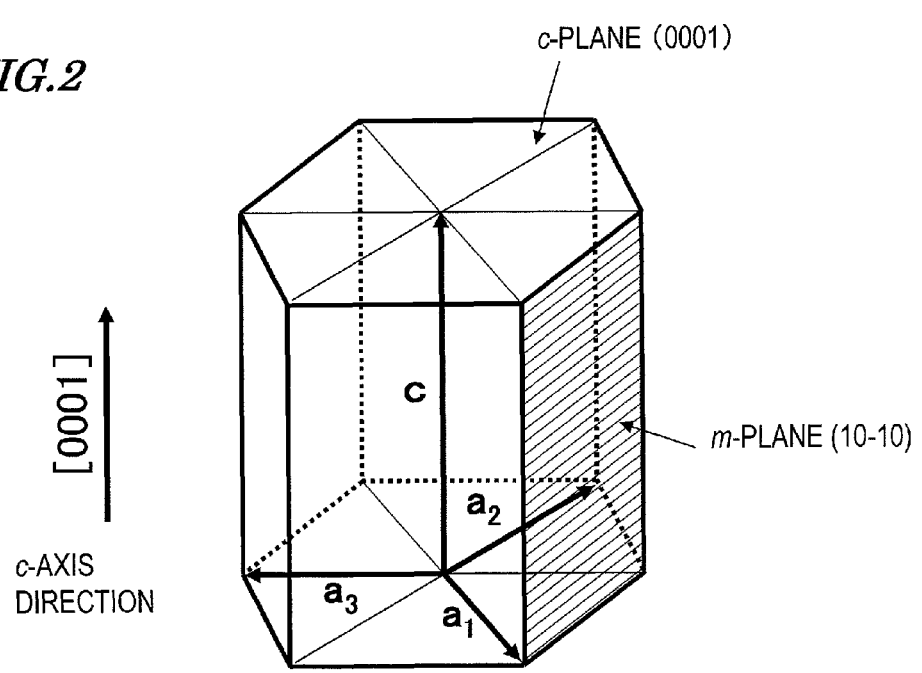
FIG. 2 is a perspective view showing primitive vectors $a_1$, $a_2$, $a_3$ and c representing a wurtzite crystal structure.

Hereinafter, preferred embodiments of the present invention will be described with reference to the accompanying drawings. In the drawings, any elements shown in multiple drawings and having substantially the same function will be identified by the same reference numeral for the sake of simplicity. It should be noted, however, that the present invention is in no way limited to the specific preferred embodiments to be described below.

Figure 3:
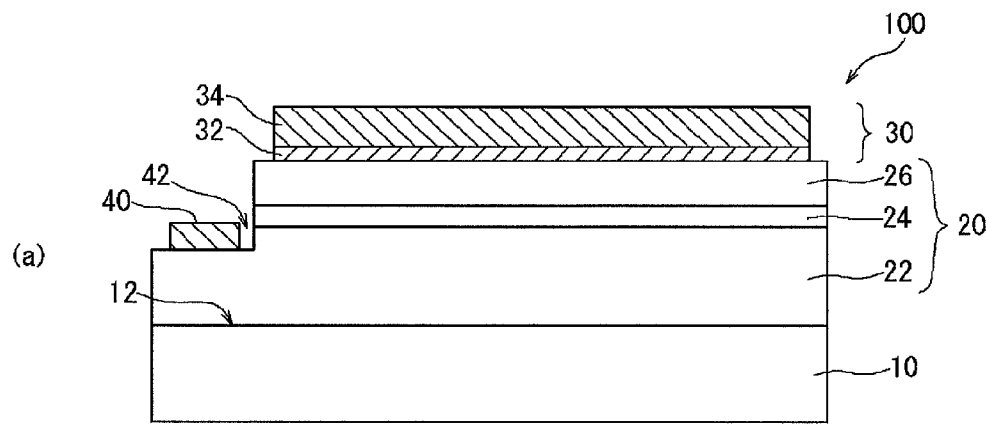
FIG. 3(a) is a schematic cross-sectional view illustrating a nitride-based semiconductor light-emitting device 100 as a preferred embodiment of the present invention.
FIGS. 3(b) and 3(c) illustrate the crystal structures of an m-plane and a c-plane, respectively.
Figure 3:
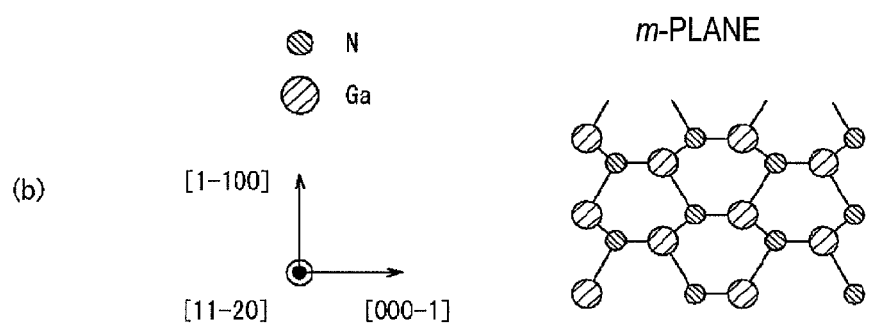
Figure 3:
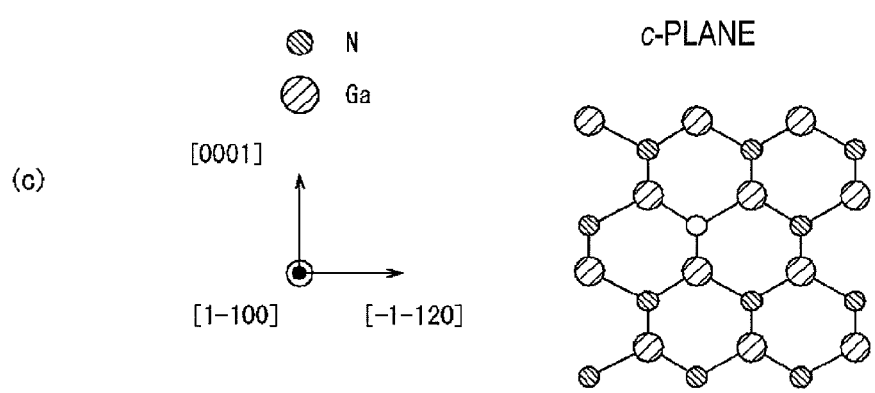

FIG. 3(a) schematically illustrates the cross-sectional structure of a nitride-based semiconductor light-emitting device 100 as a preferred embodiment of the present invention. What is illustrated in FIG. 3(a) is a semiconductor device made of GaN semiconductors and has a nitride-based semiconductor multilayer structure.

The nitride-based semiconductor light-emitting device 100 of this preferred embodiment includes a GaN-based substrate 10, of which the principal surface 12 is an m-plane, a semiconductor multilayer structure 20 that has been formed on the GaN-based substrate 10, and an electrode 30 arranged on the semiconductor multilayer structure 20. In this preferred embodiment, the semiconductor multilayer structure 20 is an m-plane semiconductor multilayer structure that has been formed through an m-plane crystal growth and its principal surface is an m-plane. It should be noted, however, that a-plane GaN could grow on an r-plane sapphire substrate in some instances. That is why according to the growth conditions, the principal surface of the GaN-based substrate 10 does not always have to be an m-plane. In the semiconductor multilayer structure 20 of the present invention, at least the surface of its semiconductor region that is in contact with an electrode needs to be an m-plane.

The nitride-based semiconductor light-emitting device 100 of this preferred embodiment includes the GaN-based substrate 10 to support the semiconductor multilayer structure 20. However, the device 100 may have any other substrate instead of the GaN-based substrate 10 and could also be used without the substrate.

FIG. 3(b) schematically illustrates the crystal structure of a nitride-based semiconductor, of which the principal surface is an m-plane, as viewed on a cross section thereof that intersects with the principal surface of the substrate at right angles. Since Ga atoms and nitrogen atoms are present on the same atomic-plane that is parallel to the m-plane, no electrical polarization will be produced perpendicularly to the m-plane. That is to say, the m-plane is a non-polar plane and no piezoelectric field will be produced in an active layer that grows perpendicularly to the m-plane. It should be noted that In and Al atoms that have been added will be located at Ga sites and will replace the Ga atoms. Even if at least some of the Ga atoms are replaced with those In or Al atoms, no electrical polarization will still be produced perpendicularly to the m-plane.

Such a GaN-based substrate, of which the principal surface is an m-plane, will be referred to herein as an "m-plane GaN-based substrate". To obtain a nitride-based semiconductor multilayer structure that has grown perpendicularly to the m-plane, typically such an m-plane GaN substrate may be used and semiconductors may be grown on the m-plane of that substrate. However, the principal surface of the substrate does not have to be an m-plane as described above, and the device as a final product could already have its substrate removed.

The crystal structure of a nitride-based semiconductor, of which the principal surface is a c-plane, as viewed on a cross section thereof that intersects with the principal surface of the substrate at right angles is illustrated schematically in FIG. 3(c) just for a reference. In this case, Ga atoms and nitrogen atoms are not present on the same atomic-plane, and therefore, electrical polarization will be produced perpendicularly to the c-plane. Such a GaN-based substrate, of which the principal surface is a c-plane, will be referred to herein as a "c-plane GaN-based substrate".

A c-plane GaN-based substrate is generally used to grow GaN-based semiconductor crystals thereon. In such a substrate, a Ga (or In) atom layer and a nitrogen atom layer that extend parallel to the c-plane are slightly misaligned from each other in the c-axis direction, and therefore, electrical polarization will be produced in the c-axis direction.

Referring to FIG. 3(a) again, on the principal surface (that is an m-plane) 12 of the m-plane GaN-based substrate 10, the semiconductor multilayer structure 20 is formed. The semiconductor multilayer structure 20 includes an active layer 24 including an $Al_aIn_bGa_cN$ layer (where a+b+c=1, a≧0, b≧0, and c≧0), and an $Al_dGa_eN$ layer (where d+e=1, d≧0 and e≧0) 26, which is located on the other side of the active layer 24 opposite to the m-plane 12. In this embodiment, the active layer 24 is an electron injection region of the nitride-based semiconductor light-emitting device 100.

The semiconductor multilayer structure 20 of this preferred embodiment has other layers, one of which is an $Al_uGa_vIn_wN$ layer (where u+v+w=1, u≧0, v≧0 and w≧0) 22 that is arranged between the active layer 24 and the substrate 10. The $Al_uGa_vIn_wN$ layer 22 of this preferred embodiment has first conductivity type, which may be n-type, for example. Optionally, an undoped GaN layer could be inserted between the active layer 24 and the $Al_dGa_eN$ layer 26.

In the $Al_dGa_eN$ layer 26, the mole fraction d of Al does not have to be uniform, but could vary either continuously or stepwise, in the thickness direction. In other words, the $Al_dGa_eN$ layer 26 could have a multilayer structure in which a number of layers with mutually different Al mole fractions d are stacked one upon the other, or could have its dopant concentration varied in the thickness direction. To reduce the contact resistance, the uppermost portion of the $Al_dGa_eN$ layer 26 (i.e., the upper surface region of the semiconductor multilayer structure 20) is preferably a layer that has an Al mole fraction d of zero (i.e., a GaN layer).

An electrode 30 has been formed on the semiconductor multilayer structure 20. The electrode 30 of this embodiment may be an electrode including a Zn layer 32. Provided on the Zn layer 32 is a metal layer 34 made of Pt. In the electrode 30, the Zn layer 32 is in contact with the p-type semiconductor region of the semiconductor multilayer structure 20 and functions as a portion of a p-electrode. The Zn layer 32 may be at least partially made of an alloy. Specifically, only part of the Zn layer 32 at the boundary with the metal layer 34 may be made of an alloy. Alternatively, the entire Zn layer 32 may be made of an alloy.

Figure 4:
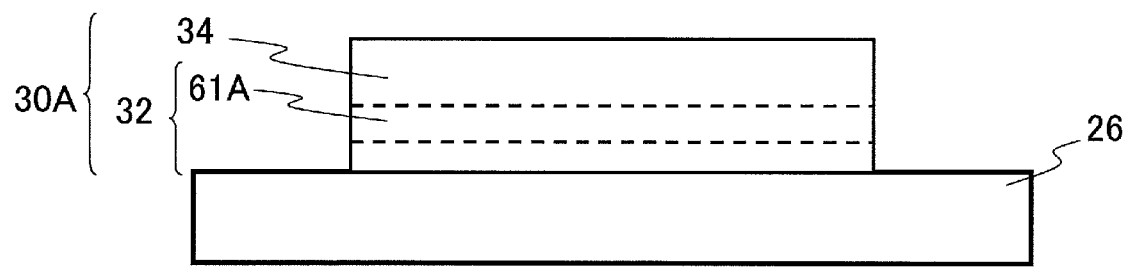
FIGS. 4(a) to 4(c) are diagrams schematically showing the distribution of Zn and Pt in the electrodes.
Figure 4:
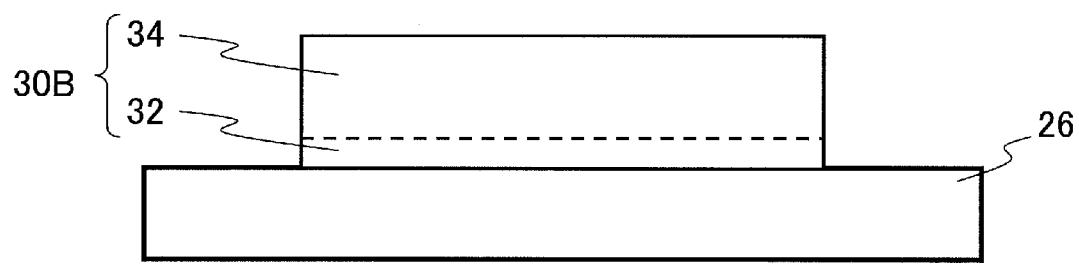
Figure 4:
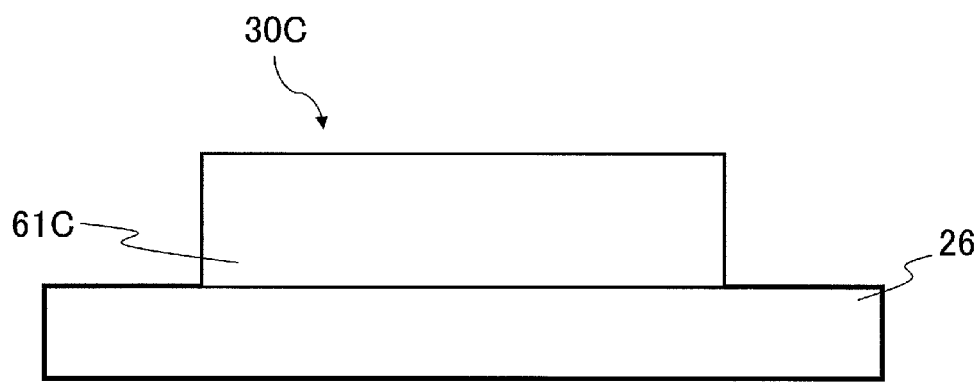

FIGS. 4(a) to 4(c) are diagrams for illustrating the process of alloying the Zn layer 32. FIG. 4(a) shows a state of the structure in which part (upper part) of the Zn layer 32 has been alloyed. The electrode 30A includes the Zn layer 32 that is in contact with the $Al_dGa_eN$ layer 26 and the metal layer 34 lying over the Zn layer 32. The upper part of the Zn layer 32 is made of a Zn-Pt alloy layer 61A.

FIG. 4(b) shows a state of the structure in which alloying of Zn and Pt has advanced such that the alloyed portion is in contact with the $Al_dGa_eN$ layer 26. In the state shown in FIG. 4(b), the Zn layer 32 included in the electrode 30B (a portion of the electrode 30B which is in contact with the $Al_dGa_eN$ layer 26) is made of a Zn—Pt alloy. In the example of the electrode 30B shown in FIG. 4(b), the metal layer 34 is lying over the Zn layer 32.

FIG. 4(c) shows a state of the electrode 30C in which the Zn layer and the Pt layer have been entirely alloyed. In this state, the electrode 30C is made only of a Zn—Pt alloy layer 61C.

The Zn—Pt alloys shown in FIGS. 4(a) to 4(c) are made of Zn and Pt (i.e., the major constituents are Zn and Pt). The structures shown in FIGS. 4(a) to 4(c) can be formed by forming a metal layer on a Zn layer and thereafter performing a heat treatment on these layers. Note that the structure shown in FIG. 4(c) may be formed by performing a vapor deposition using a mixture or compound of a metal that constitutes the metal layer 34 and Zn as a source material and thereafter performing a heat treatment on the deposited material.

In this embodiment, the Zn layer 32 is in contact with the $Al_dGa_eN$ layer 26 that is doped with a dopant of a second conductivity type (p-type). For example, the $Al_dGa_eN$ layer 26 may be doped with Mg as the dopant. Examples of other preferred p-type dopants include Zn and Be.

The metal layer 34 that is in contact with the surface of the Zn layer 32 is not limited to a Pt layer but may also be made of a metal that would make an alloy with Zn less easily than Au (e.g., Mo or Pd). In other words, at least one type of metal selected from the group consisting of Pt, Mo, and Pd may be used. As the material of the metal layer 34 that is in contact with the Zn layer 32, Au (gold) is not preferred because it would readily be alloyed with Zn.

Note that at least part of the Zn layer 32 may undergo aggregation to form islands due to a heat treatment performed after the deposition, so that the islands are separated from one another with spaces. In this case, Pt atoms that constitute the metal layer 34 intervene between the respective Zn islands. At least part of the metal layer 34 may undergo aggregation to form islands.

In the present embodiment, the thickness of the electrode 30 is, for example, from 10 nm to 200 nm. In the electrode 30, the thickness of the Zn layer 32 is smaller than that of the metal layer 34. The thickness of the Zn layer 32 is, for example, from 2 nm to 50 nm. Note that "the thickness of the Zn layer 32" herein refers to the thickness of the Zn layer after the heat treatment. When the thickness of the Zn layer 32 is 50 nm or less, peeling off of the electrode is prevented in the process of fabricating a light-emitting element.

The thickness of the metal layer (e.g., Pt layer) 34 is, for example, from 10 nm to 200 nm. The reason why the thickness of the Zn layer 32 is smaller than that of the metal layer 34 is to prevent separation of the Zn layer 32 and the $Al_dGa_eN$ layer 26 which would be caused due to disturbed balance of strain between the Zn layer 32 and the metal layer 34.

Meanwhile, the GaN-based substrate 10, of which the principal surface 12 is an m-plane, may have a thickness of 100 μm to 400 μm, for example. This is because if the wafer has a thickness of at least approximately 100 μm, then there will be no trouble handling such a wafer. It should be noted that as long as the substrate 10 of this preferred embodiment has an m-plane principal surface 12 made of a GaN-based material, the substrate 10 could have a multilayer structure. That is to say, the GaN-based substrate 10 of this preferred embodiment could also refer to a substrate, at least the principal surface 12 of which is an m-plane. That is why the entire substrate could be made of a GaN-based material. Or the substrate may also be made of the GaN-based material and another material in any combination.

In the structure of this preferred embodiment, an electrode 40 has been formed as an n-side electrode on a portion of an n-type $Al_uGa_vIn_wN$ layer 22 (with a thickness of 0.2 μm to 2 μm, for example) which is located on the substrate 10. In the example illustrated in FIG. 3(a), in the region of the semiconductor multilayer structure 20 where the electrode 40 is arranged, a recess 42 has been cut so as to expose a portion of the n-type $Al_uGa_vIn_wN$ layer 22. And the electrode has been formed on the exposed surface of the n-type $Al_uGa_vIn_wN$ layer 22 at the bottom of the recess 42. The electrode 40 may have a multilayer structure consisting of Ti, Al and Ti layers and may have a thickness of 100 nm to 200 nm, for example.

In this preferred embodiment, the active layer 24 has a GaInN/GaN multi-quantum well (MQW) structure (with a thickness of 81 nm, for example) in which $Ga_{0.9}In_{0.1}N$ well layers (each having a thickness of 9 nm, for example) and GaN barrier layers (each having a thickness of 9 nm, for example) are alternately stacked one upon the other.

On the active layer 24, stacked is the p-type $Al_dGa_eN$ layer 26, which may have a thickness of 0.2 μm to 2 μm. Optionally, an undoped GaN layer could be inserted between the active layer 24 and the $Al_dGa_eN$ layer 26 as described above.

In addition, a GaN layer of the second conductivity type (which may be p-type, for example) could be formed on the $Al_dGa_eN$ layer 26. Furthermore, a contact layer of $p^+$-GaN and the Zn layer 32 could be stacked in this order on that GaN layer. In that case, the GaN contact layer could also be regarded as forming part of the $Al_dGa_eN$ layer 26, not a layer that has been stacked separately from the $Al_dGa_eN$ layer 26.

Next, the feature and specificity of the present embodiment are described in more detail with reference to FIG. 5 and FIG. 6.

Figure 5:
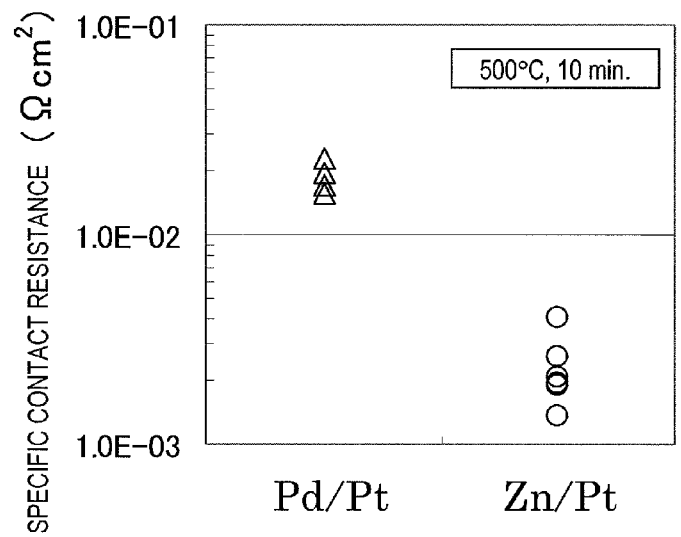
FIG. 5 is a graph which shows the specific contact resistance values ($\Omega \cdot cm^2$) of an electrode of Pd/Pt layers and an electrode of Zn/Pt layers.

FIG. 5 is a graph showing the specific contact resistance ($\Omega \cdot cm^2$) of the Pd/Pt electrode and the Zn/Pt electrode. The Pd/Pt electrode used herein was an electrode formed by depositing a 40 nm thick Pd layer and a 35 nm thick Pt layer on a p-type m-plane GaN layer and thereafter performing a heat treatment on the resultant structure at 500° C. for 10 minutes in a nitrogen atmosphere (m-plane GaN (Pd/Pt)). The Zn/Pt electrode used herein was an electrode formed by depositing a 7 nm Zn layer and a 75 nm Pt layer on a p-type m-plane GaN layer and thereafter performing a heat treatment on the resultant structure at 500° C. for 10 minutes in a nitrogen atmosphere (m-plane GaN (Zn/Pt)). In all the experimental examples disclosed in the present application, the Zn layer and the Pt layer were deposited by a common electron beam evaporation process.

The Zn/Pt electrode and the Pd/Pt electrode are both in contact with the Mg-doped m-plane GaN layer. The m-plane GaN layer that is in contact with these electrodes is doped with $7 \times 10^{19}$ $cm^{-3}$ Mg to a depth of 20 nm as measured from the surface (i.e., the uppermost surface region with a thickness of 20 nm). On the other hand, the rest of the m-plane GaN layer, of which the depth exceeds 20 nm as measured from the surface, is doped with $1 \times 10^{19}$ $cm^{-3}$ Mg. If the concentration of the p-type dopant is locally increased in this manner in the uppermost surface region of the GaN layer that is in contact with the p-electrode, the contact resistance can be reduced to the lowest possible level. On top of that, by adopting such a doping scheme, the in-plane non-uniformity of the current-voltage characteristic can also be reduced. As a result, the variation in drive voltage between respective chips can also be reduced. That is why in every experimental example disclosed in this application, the surface region of the p-type GaN layer that is in contact with the electrode is doped with $7\times10^{19}$ cm$^{-3}$ Mg to a depth of 20 nm as measured from the surface, while the other deeper region is doped with $1\times10^{19}$ cm$^{-3}$ Mg.

The specific contact resistance was evaluated using the TLM (Transmission Line Method). Referring to the ordinate axis, "1.0E−01" means "$1.0\times10^{-1}$", and "1.0E−02" means "$1.0\times10^{-2}$". Hence, "1.0E+X" means "$1.0\times10^{X}$".

In general, contact resistance R is inversely proportional to the area of the contact, S (cm$^2$). Where R(Ω) is the contact resistance, the relationship of R=Rc/S holds. The proportionality constant, Rc, is called specific contact resistance, which equals to the contact resistance R when the contact area S is 1 cm$^2$. Thus, the value of the specific contact resistance does not depend on the contact area S and hence serves as an index for evaluation of the contact characteristic. Hereinafter, "specific contact resistance" is sometimes abbreviated as "contact resistance".

As seen from FIG. 5, the Zn/Pt electrode exhibits a lower specific contact resistance (Ω·cm$^2$) than the Pd/Pt electrode by approximately one order of magnitude. PCT/JP2009/007284 discloses that the contact resistance obtained when an electrode containing Zn is in contact with a c-plane p-type GaN layer is equal to or slightly higher than that obtained when the Pd/Pt electrode is in contact with a c-plane GaN layer. It is also disclosed on the other hand that, when the contact surface is an m-plane, the electrode containing Zn exhibits a significantly lower contact resistance than the Pd/Pt electrode. It is inferred from this result that the present invention that employs the Zn/Pt electrode would produce similar effects.

The research of the present inventor showed that the current-voltage characteristic of the conventional Pd/Pt electrode was a Schottky-type non-ohmic characteristic (Schottky voltage: about 2 V), whereas no Schottky voltage was detected in the current-voltage characteristic of the Zn/Pt electrode. It was hence found that the Zn/Pt electrode substantially forms an ohmic contact with the p-type m-plane GaN layer. Disappearance of the Schottky voltage is critical in decreasing the operating voltages of devices, such as light-emitting diodes, laser diodes, etc.

Generally, in fabrication of an excellent p-electrode of a low contact resistance on c-plane GaN, using a metal of a large work function, for example, Pd (work function=5.1 eV) or Pt (work function=5.6 eV), is common knowledge in the art. The work function of Zn (4.3 eV) is smaller than those of other contact electrode materials.

For comparison purposes, the present inventor formed a Zn layer as the p-electrode on a p-type c-plane GaN layer and evaluated the contact resistance using a TLM method. The Zn layer, which was the subject of the evaluation, was 200 nm thick as deposited and was subjected to a heat treatment at 500° C. for 10 minutes in a nitrogen atmosphere. As a result, the contact resistance of the Zn layer formed on the c-plane GaN layer was a very high value, about $3.0\times10^{-1}$ Ω·cm$^2$.

For the reasons described above, it is estimated that preferred contact characteristics will never be achieved even when a Zn layer is used for a p-type contact electrode of m-plane GaN. The present inventor dared to form a Zn layer so as to be in contact with the m-plane of the p-type GaN and performed a heat treatment. The present inventor found such a phenomenon that the contact resistance can be greatly reduced by performing an appropriate heat treatment, and reached completion of the present invention. The reason for the decrease of the contact resistance has not been identified but is inferred to be due to specific behaviors of Ga atoms and N atoms in the vicinity of the surface of m-plane GaN as will be described later.

The present inventor used a variety of metals of different work functions, such as Al, Ni, Au, Pd, Pt, etc., as the material of the electrodes for m-plane GaN, and measured the contact resistance of the electrodes. As a result, the present inventor experimentally demonstrated that, even in the case of the m-plane GaN, lower contact resistances are achieved by metals of larger work functions (Pd and Pt). See Japanese Patent Application No. 2009-030147.

Next, preferred heat treatment conditions are described. FIG. 6 is a graph which shows the dependence of the specific contact resistance of the Pd/Pt electrode and the Zn/Pt electrode on the heat treatment temperature. The Pd/Pt electrodes used herein were electrodes formed by depositing a 40 nm thick Pd layer and a 35 nm thick Pt layer on a p-type m-plane GaN layer and thereafter performing a heat treatment on the resultant structure at different temperatures in a nitrogen atmosphere (m-plane GaN (Pd/Pt)). The Zn/Pt electrodes used herein were electrodes formed by depositing a 7 nm Zn layer and a 75 nm Pt layer on a p-type m-plane GaN layer and thereafter performing a heat treatment on the resultant structure at different temperatures in a nitrogen atmosphere (m-plane GaN (Zn/Pt)).

Figure 6:
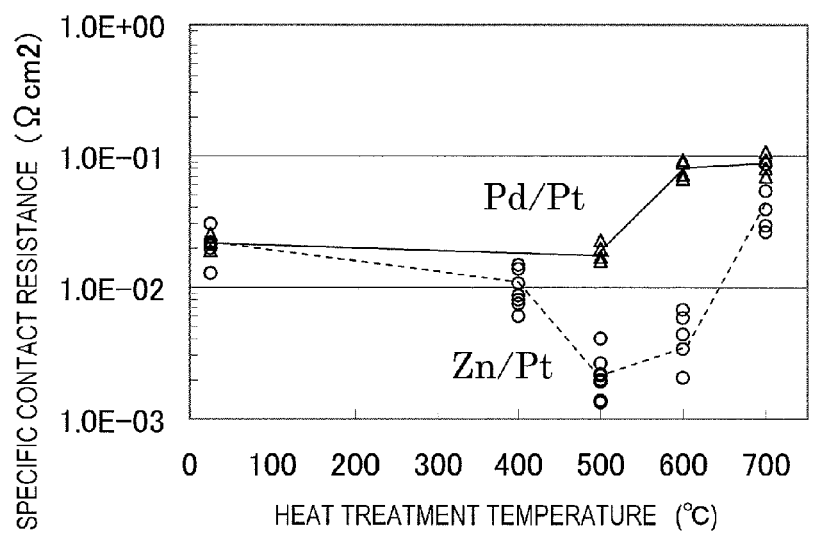
FIG. 6 is a graph which shows the dependence of the contact resistance on the heat treatment temperature.

As seen from FIG. 6, in the case of the m-plane GaN (Pd/Pt) electrode, the contact resistance of the m-plane GaN scarcely changed after the heat treatment at 500° C. At heat treatment temperatures higher than 500° C., an increase of the contact resistance was detected.

On the other hand, in the case of the m-plane GaN (Zn/Pt) electrode, the contact resistance sharply decreased at temperatures higher than 400° C. And, at 500° C., the contact resistance further decreased. When the temperature was further increased to 600° C., the contact resistance was higher than that obtained when the heat treatment temperature was 500° C. but was smaller than the contact resistance obtained in the case of the conventional m-plane GaN (Pd/Pt) electrode.

Therefore, the heat treatment temperature for the m-plane GaN (Zn/Pt) is preferably 400° C. or higher, for example. The upper limit of the heat treatment temperature is preferably 700° C. or less because, if it exceeds 700° C. to reach a predetermined temperature (e.g., 800° C.) or higher, deterioration in the film quality of the electrode and the GaN layer would increase. More preferably, it is in the temperature range of 400° C. to 650° C. Still more preferably, it is in the temperature range of 450° C. to 600° C.

The reason why the contact resistance greatly decreases when the electrode structure of the present embodiment (Zn/Pt) is provided on the m-plane GaN is inferred to be that the heat treatment allows only Ga atoms to be diffused toward the electrode side while N atoms are not diffused toward the electrode side. It is inferred that only Ga of the GaN is diffused toward the electrode side, and accordingly, the concentration of N is lower than the concentration of Ga in the Zn layer.

When Ga of the p-type GaN is diffused toward the electrode side, the outermost surface of the p-type GaN is lacking Ga atoms, i.e., Ga vacancies are formed. The Ga vacancies have acceptor-like properties, and therefore, as the number of Ga vacancies increases in the vicinity of the interface between the electrode and the p-type GaN, holes more readily pass through the Schottky barrier of this interface by means of tunneling. Thus, it is inferred that the contact resistance decreases when the Zn layer is formed so as to be in contact with the m-plane surface of the p-type GaN layer.

On the other hand, when N atoms as well as Ga atoms are diffused toward the electrode side, the outermost surface of the p-type GaN is lacking N atoms, i.e., N vacancies are also formed. Since the N vacancies have donor-like properties, charge compensation occurs between the Ga vacancies and the N vacancies at the outermost surface of the p-type GaN. It is also inferred that the omission of the N atoms would degrade the crystallinity of GaN crystals. Thus, when N atoms as well as Ga atoms are diffused toward the electrode side, the contact resistance between the p-type GaN layer and the electrode is high.

It is inferred that the behaviors of respective ones of such elements (Ga, N) occur even when some of Ga atoms are replaced by Al or In atoms in the GaN layer with which the Zn layer is in contact. It is also inferred that the same applies even when the GaN-based semiconductor layer with which the Zn layer is in contact is doped with an element other than Mg as a dopant.

Next, referring again to FIG. 3(a), the structure of the present embodiment is described in more detail.

As shown in FIG. 3(a), the light-emitting device 100 of the present embodiment includes the m-plane GaN substrate 10 and the $Al_uGa_vIn_wN$ layer 22 (where $u+v+w=1$, $u \geq 0$, $v \geq 0$, $w \geq 0$) provided on the substrate 10. In this example, the m-plane GaN substrate 10 is an n-type GaN substrate (for example, 100 μm thick). The $Al_uGa_vIn_wN$ layer 22 is an n-type GaN layer (for example, 2 μm thick). Provided on the $Al_uGa_vIn_wN$ layer 22 is an active layer 24. In other words, a semiconductor multilayer structure 20 including at least the active layer 24 is provided on the m-plane GaN substrate 10.

In the semiconductor multilayer structure 20, an active layer 24 including an $Al_aIn_bGa_cN$ layer (where $a+b+c=1$, $a \geq 0$, $b \geq 0$ and $c \geq 0$) has been formed on the $Al_xGa_yIn_zN$ layer 22. The active layer 24 consists of InGaN well layers with an In mole fraction of approximately 25% and GaN barrier layers, both the well layers and the barrier layers may have a thickness of 9 nm each, and the well layers may have a well layer period of three. On the active layer 24, stacked is an $Al_dGa_eN$ layer (where $d+e=1$, $d \geq 0$ and $e \geq 0$) 26 of the second conductivity type (which may be p-type, for example), which may be an AlGaN layer with an Al mole fraction of 10% and may have a thickness of 0.2 μm. In this preferred embodiment, the $Al_dGa_eN$ layer 26 is doped with Mg as a p-type dopant to a level of approximately $10^{18}$ cm$^{-3}$, for example. Also, in this example, an undoped GaN layer (not shown) is interposed between the active layer 24 and the $Al_dGa_eN$ layer 26.

Furthermore, in this example, on the $Al_dGa_eN$ layer 26, stacked is a GaN layer (not shown) of the second conductivity type (which may be p-type, for example). In addition, on the contact layer of p$^+$-GaN, stacked in this order are a Zn layer 32 and a Pt layer 34. And this stack of the Zn layer 32 and the Pt layer 34 is used as an electrode (i.e., a p-electrode) 30.

This semiconductor multilayer structure 20 further has a recess 42 that exposes the surface of the $Al_uGa_vIn_wN$ layer 22. And an electrode 40 (n-electrode) has been formed on the $Al_uGa_vIn_wN$ layer 22 at the bottom of the recess 42, which may have a width (or diameter) of 20 μm and a depth of 1 μm, for example. The electrode 40 may have a multilayer structure consisting of Ti, Al and Pt layers, which may have thicknesses of 5 nm, 100 nm and 10 nm, respectively.

The present inventors discovered that the nitride-based semiconductor light-emitting device 100 of this preferred embodiment could have an operating voltage Vop that was approximately 2.0 V lower than that of a conventional m-plane LED with a Pd/Pt electrode, and therefore, could cut down the power dissipation as a result.

Next, a method for fabricating the nitride-based semiconductor light-emitting device 100 of this embodiment is described while still referring to FIG. 3(a).

First of all, an m-plane substrate 10 is prepared. In this preferred embodiment, a GaN substrate is used as the substrate 10. The GaN substrate of this preferred embodiment is obtained by HVPE (hydride vapor phase epitaxy).

For example, a thick GaN film is grown to a thickness of several millimeters on a c-plane sapphire substrate, and then diced perpendicularly to the c-plane (i.e., parallel to the m-plane), thereby obtaining m-plane GaN substrates. However, the GaN substrate does not have to be prepared by this particular method. Alternatively, an ingot of bulk GaN may be made by a liquid phase growth process such as a sodium flux process or a melt-growth method such as an ammonothermal process and then diced parallel to the m-plane.

The substrate 10 does not have to be a GaN substrate but may also be a gallium oxide substrate, an SiC substrate, an Si substrate or a sapphire substrate, for example. To grow an m-plane GaN-based semiconductor on the substrate by epitaxy, the principal surface of the SiC or sapphire substrate is preferably also an m-plane. However, in some instances, a-plane GaN could grow on an r-plane sapphire substrate. That is why according to the growth conditions, the surface on which the crystal growth should take place does not always have to be an m-plane. In any case, at least the surface of the semiconductor multilayer structure 20 should be an m-plane. In this preferred embodiment, crystal layers are formed one after another on the substrate 10 by MOCVD (metalorganic chemical vapor deposition) process.

Next, an $Al_uGa_vIn_wN$ layer 22 is formed on the m-plane GaN substrate 10. As the $Al_uGa_vIn_wN$ layer 22, AlGaN may be deposited to a thickness of 3 μm, for example. A GaN layer may be deposited by supplying TMG(Ga(CH$_3$)$_3$), TMA(Al(CH$_3$)$_3$) and NH$_3$ gases onto the m-plane GaN substrate 10 at 1,100° C., for example.

Subsequently, an active layer 24 is formed on the $Al_uGa_vIn_wN$ layer 22. In this example, the active layer 24 has a GaInN/GaN multi-quantum well (MQW) structure in which $Ga_{0.9}In_{0.1}N$ well layers and GaN barrier layers, each having a thickness of 9 nm, have been stacked alternately to have an overall thickness of 81 nm. When the $Ga_{0.9}In_{0.1}N$ well layers are formed, the growth temperature is preferably lowered to 800° C. to introduce In.

Thereafter, an undoped GaN layer is deposited to a thickness of 30 nm, for example, on the active layer 24, and then an $Al_dGa_eN$ layer 26 is formed on the undoped GaN layer. As the $Al_dGa_eN$ layer 26, p-$Al_{0.14}Ga_{0.86}N$ is deposited to a thickness of 70 nm by supplying TMG, NH$_3$, TMA, TMI gases and Cp$_2$Mg (cyclopentadienyl magnesium) gas as a p-type dopant.

Next, a p-GaN contact layer is deposited to a thickness of 0.5 μm, for example, on the $Al_dGa_eN$ layer 26. In forming the p-GaN contact layer, Cp$_2$Mg is supplied as a p-type dopant.

Thereafter, respective portions of the p-GaN contact layer, the $Al_dGa_eN$ layer 26, the undoped GaN layer, and the active layer 24 are removed by performing a chlorine-based dry etching process, thereby making a recess 42 and exposing a region of the $Al_xGa_yIn_zN$ layer 22 where an n-electrode will be formed. Then, Ti/Pt layers are deposited as an n-electrode 40 on the region reserved for an n-type electrode at the bottom of the recess 42.

On the p-GaN contact layer, a Zn layer 32 is formed using a common vapor deposition method (a resistance heating method, an electron beam evaporation process, or the like), and a Pt layer 34 is further formed on the Zn layer 32 to obtain a p-electrode 30. The Zn layer 32 may be formed by sputtering, a thermal CVD process, or a molecular beam epitaxy (MBE), as well as a vacuum vapor deposition method.

Optionally, the substrate 10 and a portion of the $Al_uGa_vIn_wN$ layer 22 could be removed after that by some technique such as laser lift-off, etching or polishing. In that case, either only the substrate 10 or the substrate 10 and a portion of the $Al_uGa_vIn_wN$ layer 22 could be removed selectively. It is naturally possible to leave the substrate 10 and the $Al_uGa_vIn_wN$ layer 22 as they are without removing them. By performing these process steps, the nitride-based semiconductor light-emitting device 100 of this preferred embodiment is completed.

In the nitride-based semiconductor light-emitting device 100 of this preferred embodiment, when a voltage is applied to between the n- and p-electrodes 40 and 30, holes are injected from the p-electrode 30 into the active layer 24 and electrons are injected from the n-electrode 40 into the active layer 24, thus producing photoluminescence with a wavelength of about 450 nm.

Figure 7:
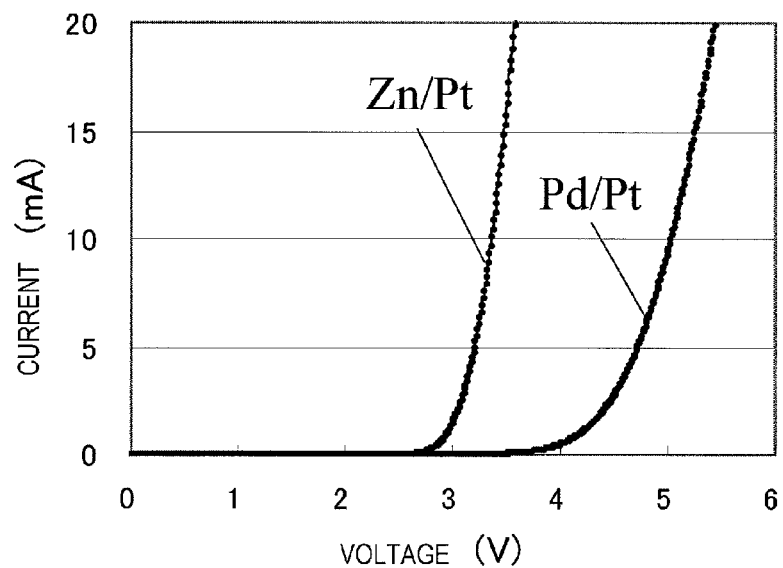
FIG. 7 shows a graph representing the current-voltage characteristic of a light-emitting diode which includes an electrode of Zn/Pt layers and a graph representing the current-voltage characteristic of a light-emitting diode which includes a conventional electrode of Pd/Pt layers.

FIG. 7 shows the current-voltage characteristic of a light-emitting diode which includes an electrode formed by Zn/Pt layers. For comparison purposes, the characteristic of a light-emitting diode which has the same nitride-based semiconductor structure of the light-emitting diode but includes an electrode formed by Pd/Pt layers is also shown together. In the Zn/Pt electrode before the heat treatment, the thickness of the Zn layer was 7 nm, and the thickness of the Pt layer was 75 nm. In the Pd/Pt electrode before the heat treatment, the thickness of the Pd layer was 40 nm, and the thickness of the Pt layer was 35 nm. The Zn/Pt electrode was subjected to a heat treatment at 500° C. for 10 minutes. The Pd/Pt electrode was subjected to a heat treatment at 500° C. for 10 minutes.

The threshold voltage of the light-emitting diode which includes the electrode of Pd/Pt layers was about 3.7 V, whereas the threshold voltage of the light-emitting diode which includes the electrode of Zn/Pt layers was about 2.7 V. This means a considerable reduction of the threshold voltage. Comparing in terms of the operating voltage for the current value of 20 mA, it is seen that the operating voltage of the light-emitting diode which includes the electrode of Zn/Pt layers is smaller than that of the electrode of Pd/Pt layers by 2.0 V or more.

The present embodiment employs Zn as the material of the p-electrode, which is more abundant on the earth than Pd. Zn is more resistant to oxidation than Mg. The Zn layer can advantageously be formed by a commonly-employed vapor deposition method. Also, it was confirmed that the adhesion between the m-plane GaN layer and the Zn layer was excellent.

While the present invention has been described with respect to preferred embodiments thereof, this invention is in no way limited to those specific preferred embodiments but could be modified in numerous ways and may assume many embodiments other than those specifically described above.

The light-emitting device described above could be used as it is as a light source. However, if combined with a resin including a phosphor that produces wavelength conversion according to the present invention, for example, the light-emitting device can be suitably used as a light source with an expanded operating wavelength range (such as a white light source).

Figure 8:
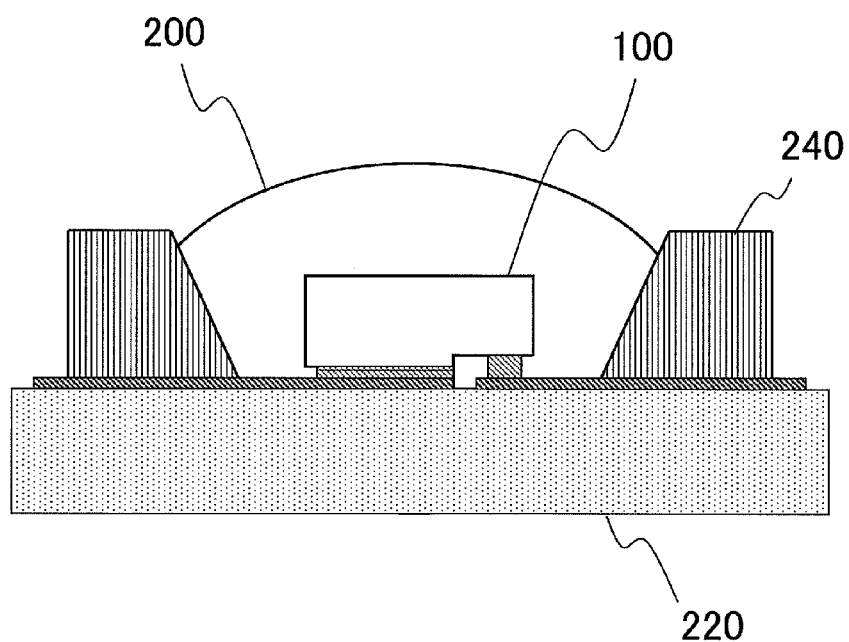
FIG. 8 is a cross-sectional view illustrating a preferred embodiment of a white light source.

FIG. 8 is a schematic representation illustrating an example of such a white light source. The light source shown in FIG. 8 includes a light-emitting device 100 with the structure shown in FIG. 3(a) and a resin layer 200 in which particles of a phosphor such as YAG (Yttrium Aluminum Garnet) are dispersed to change the wavelength of the light emitted from the light-emitting device 100 into a longer one. The light-emitting device 100 is mounted on a supporting member 220 on which a wiring pattern has been formed. And on the supporting member 220, a reflective member 240 is arranged so as to surround the light-emitting device 100. The resin layer 200 has been formed so as to cover the light-emitting device 100.

Note that the contact structure of the present invention provides the above-described excellent effects when the p-type semiconductor region that is in contact with the Zn layer is formed of a GaN-based semiconductor, specifically an $Al_xIn_yGa_zN$ semiconductor (x+y+z=1, x≧0, y≧0, z≧0). As a matter of course, such an effect of reducing the contact resistance can also be obtained in light-emitting devices other than LEDs (e.g., semiconductor lasers) and devices other than the light-emitting devices (e.g., transistors and photodetectors).

The actual m-plane does not always have to be a plane that is exactly parallel to an m-plane but may be slightly tilted from the m-plane by 0±1 degree.

INDUSTRIAL APPLICABILITY

A nitride-based semiconductor device of the present invention has a reduced contact resistance between the m-plane surface of the p-type semiconductor region and the p-electrode and is therefore especially suitably used for light-emitting diodes (LED).

REFERENCE SIGNS LIST 10 substrate (GaN-based substrate)
12 surface of substrate (m-plane)
20 semiconductor multilayer structure
22 $Al_uGa_vIn_wN$ layer
24 active layer
26 $Al_dGa_eN$ layer
30, 30A, 30B, 30C p-electrode
32 Zn layer
34 metal layer (Pt layer)
40 n-electrode
42 recess
61A, 61C Zn—Pt alloy layer
100 nitride-based semiconductor light-emitting device
200 resin layer in which wavelength-converting phosphors are dispersed
220 supporting member
240 reflective member

The invention claimed is:

1. A nitride-based semiconductor device, comprising:
  a nitride-based semiconductor multilayer structure including a p-type GaN based semiconductor region, a surface of the p-type GaN based semiconductor region being an m-plane; and
  an electrode that is formed on the surface of the p-type GaN based semiconductor region,
  wherein the p-type GaN based semiconductor region is made of an $Al_xIn_yGa_zN$ semiconductor (where x+y+z=1, x≧0, y≧0, and z≧0),
  the electrode includes a Zn layer which is in contact with the surface of the p-type GaN based semiconductor region, and
  concentration of N is lower than concentration of Ga in the Zn layer.

2. The nitride-based semiconductor device of claim 1, wherein
  the electrode includes the Zn layer and a metal layer formed on the Zn layer, and the metal layer is made of at least one type of metal selected from the group consisting of Pt, Mo, and Pd.

3. The nitride-based semiconductor device of claim 1, wherein the semiconductor multilayer structure includes an active layer which includes an $Al_aIn_bGa_cN$ layer (where a+b+c=1, a≧0, b≧0 and c≧0), the active layer being configured to emit light.

4. The nitride-based semiconductor device of claim 1, wherein the p-type GaN based semiconductor region is a p-type contact layer.

5. The nitride-based semiconductor device of claim 1, further comprising a semiconductor substrate that supports the semiconductor multilayer structure.

6. The nitride-based semiconductor device of claim 1, wherein the Zn layer is at least partially made of an alloy.

7. The nitride-based semiconductor device of claim 2, wherein a thickness of the Zn layer is smaller than a thickness of the metal layer.

8. A light source, comprising:
a supporting member;
a nitride-based semiconductor light-emitting device; and
a wavelength converter including a phosphor that converts a wavelength of light emitted from the nitride-based semiconductor light-emitting device,
wherein the nitride-based semiconductor light-emitting device includes
a nitride-based semiconductor multilayer structure including a p-type GaN based semiconductor region, a surface of the p-type GaN based semiconductor region being an m-plane, and
an electrode that is formed on the surface of the p-type GaN based semiconductor region,
the p-type GaN based semiconductor region is made of an $Al_xIn_yGa_zN$ semiconductor (where x+y+z=1, x≧0, y≧0, and z≧0),
the electrode includes a Zn layer which is in contact with the surface of the p-type GaN based semiconductor region,
the nitride-based semiconductor light-emitting device is mounted in a face down manner on the supporting member, and
concentration of N is lower than concentration of Ga in the Zn layer.

9. The light source of claim 8, wherein the Zn layer is at least partially made of an alloy.

10. A method for fabricating a nitride-based semiconductor device, comprising the steps of:
(a) providing a substrate;
(b) forming on the substrate a nitride-based semiconductor multilayer structure including a p-type GaN based semiconductor region that is made of an $Al_xIn_yGa_zN$ semiconductor (where x+y+z=1, x≧0, y≧0, and z≧0), a surface of the p-type GaN based semiconductor region being an m-plane; and
(c) forming an electrode on the surface of the p-type GaN based semiconductor region of the semiconductor multilayer structure,
wherein step (c) includes forming a Zn layer on the surface of the p-type GaN based semiconductor region, and
Ga atoms are diffused toward the electrode side while N atoms are not diffused toward the electrode side.

11. The method of claim 10, wherein step (c) includes, after the formation of the Zn layer, forming a metal layer which is made of at least one type of metal selected from the group consisting of Pt, Mo, and Pd.

12. The method of claim 10, wherein step (c) includes performing a heat treatment on the Zn layer.

13. The method of claim 10, further comprising removing the substrate after step (b).

14. The method of claim 10, wherein the Zn layer is at least partially alloyed.

15. The method of claim 12, wherein the heat treatment is performed at a temperature of 400° C. to 650° C.

16. The method of claim 15, wherein the heat treatment is performed at a temperature of 450° C. to 600° C.

17. A nitride-based semiconductor device, comprising:
a nitride-based semiconductor multilayer structure including a p-type GaN based semiconductor region, a surface of the p-type GaN based semiconductor region being an m-plane; and
an electrode that is formed on the surface of the p-type GaN based semiconductor region,
wherein the GaN based p-type semiconductor region is made of an $Al_xIn_yGa_zN$ semiconductor (where x+y+z=1, x≧0, y≧0, and z≧0),
the electrode includes a Zn island formed on the surface of the p-type GaN based semiconductor region, and
concentration of N is lower than concentration of Ga in the Zn layer.

18. The nitride-based semiconductor device of claim 17, wherein
the electrode includes a metal layer formed on the Zn island, and
the metal layer is made of at least one type of metal selected from the group consisting of Pt, Mo, and Pd.

19. A nitride-based semiconductor device, comprising:
a nitride-based semiconductor multilayer structure including a p-type GaN based semiconductor region, a surface of the p-type GaN based semiconductor region being an m-plane; and
an electrode that is formed on the surface of the p-type GaN based semiconductor region,
wherein the p-type GaN based semiconductor region is made of an $Al_xIn_yGa_zN$ semiconductor (where x+y+z=1, x≧0, y≧0, and z≧0),
the electrode includes a Zn layer which is in contact with the surface of the p-type GaN based semiconductor region,
the Zn layer is made of Zn and at least one type of metal selected from the group consisting of Pt, Mo, and Pd, and
concentration of N is lower than concentration of Ga in the Zn layer.

20. A nitride-based semiconductor device, comprising:
a nitride-based semiconductor multilayer structure including a p-type GaN based semiconductor region, a surface of the p-type GaN based semiconductor region being an m-plane; and
an electrode that is arranged on the p-type GaN based semiconductor region,
wherein the p-type GaN based semiconductor region is made of an $Al_xIn_yGa_zN$ semiconductor (where x+y+z=1, x≧0, y≧0, and z≧0),
the electrode is made only of an alloy layer which is in contact with the surface of the p-type GaN based semiconductor region,
the alloy layer is made of Zn and at least one type of metal selected from the group consisting of Pt, Mo, and Pd, and
concentration of N is lower than concentration of Ga in the Zn layer.

21. The nitride-based semiconductor device of claim 20, wherein the alloy layer is formed by forming a Zn layer so as to be in contact with the surface of the p-type GaN based semiconductor region and a metal layer on the Zn layer, and thereafter performing a heat treatment.

* * * * *